(12) United States Patent
Lu

(10) Patent No.: US 11,567,379 B2
(45) Date of Patent: Jan. 31, 2023

(54) DISPLAY PANEL AND DISPLAY DEVICE

(71) Applicant: WUHAN CHINA STAR OPTOELECTRONICS TECHNOLOGY CO., LTD., Hubei (CN)

(72) Inventor: Yantao Lu, Hubei (CN)

(73) Assignee: WUHAN CHINA STAR OPTOELECTRONICS TECHNOLOGY CO., LTD., Hubei (CN)

( * ) Notice: Subject to any disclaimer, the term of this patent is extended or adjusted under 35 U.S.C. 154(b) by 92 days.

(21) Appl. No.: 17/056,802

(22) PCT Filed: Oct. 30, 2020

(86) PCT No.: PCT/CN2020/125130
§ 371 (c)(1),
(2) Date: Nov. 19, 2020

(87) PCT Pub. No.: WO2022/062064
PCT Pub. Date: Mar. 31, 2022

(65) Prior Publication Data
US 2022/0187644 A1    Jun. 16, 2022

(30) Foreign Application Priority Data

Sep. 24, 2020    (CN) .......................... 202011014025.9

(51) Int. Cl.
*G02F 1/1368*    (2006.01)
*G02F 1/1362*    (2006.01)
*H01L 27/32*    (2006.01)

(52) U.S. Cl.
CPC ...... *G02F 1/1368* (2013.01); *G02F 1/136286* (2013.01); *H01L 27/3232* (2013.01)

(58) Field of Classification Search
CPC ............ G02F 1/1368; G02F 1/136286; G02F 1/13629; G02F 1/133504; G02F 1/133528; G02F 1/133536; G02F 1/1336; G02F 1/133603; G02F 1/1347; G02F 1/13306; G02F 1/13439; G02F 1/1313; G02F 1/13318; G02F 1/13338; G02F 1/133541; G02F 2201/44; G02F 1/133512;
(Continued)

(56) References Cited

U.S. PATENT DOCUMENTS 6,067,134 A    5/2000    Akiyama et al.
7,719,185 B2   5/2010    Jin et al.
(Continued)

FOREIGN PATENT DOCUMENTS

CN    1988169 A     6/2007
CN    103426901 A   12/2013
(Continued)

*Primary Examiner* — Hoan C Nguyen
(74) *Attorney, Agent, or Firm* — Mark M. Friedman

(57) ABSTRACT

The present application proposes a display panel and a display device. The display panel includes a first sub-display panel and a second sub-display panel disposed on one side of the first sub-display panel. The first sub-display panel includes a first substrate and a driving circuit layer disposed
(Continued)

on the first substrate, and the driving circuit layer allows the first sub-display panel or/and the second sub-display panel to transmit light.

6 Claims, 6 Drawing Sheets

(58) Field of Classification Search
CPC ......... G02F 1/133345; G02F 1/133514; G02F 1/134309; G02F 1/1339; G02F 1/136209; G02F 1/133621; G02F 1/133622; G02F 1/1362; H01L 27/3232; H01L 27/3276; H01L 27/124; H01L 27/3244; H01L 51/5281; H01L 27/326; H01L 25/50; H01L 2924/0002; H01L 2924/00; H01L 2251/5323; H01L 27/1248; H01L 27/3225; H01L 27/3211; H01L 27/3262; G02B 5/0242; G06F 3/046; G06F 3/0412; G06F 2203/04103; G06F 3/03545; H05K 3/064; G01P 15/125; G01P 15/0802; G09G 3/3413; G09G 3/3208; G09G 3/2003; G09G 3/342; G09G 3/36; G09G 2320/0646; G09G 3/3648; G09G 2320/0666; G09G 2310/0235
See application file for complete search history.

(56) References Cited

U.S. PATENT DOCUMENTS

| | | | |
|---|---|---|---|
| 9,709,844 | B2 | 7/2017 | Lee et al. |
| 9,748,320 | B2 | 8/2017 | Hong et al. |
| 2007/0138941 | A1* | 6/2007 | Jin ...................... H01L 27/3244 313/503 |
| 2012/0299816 | A1* | 11/2012 | Lee ...................... G09G 3/3225 345/204 |
| 2013/0314633 | A1 | 11/2013 | Koo et al. |
| 2013/0314647 | A1* | 11/2013 | Yim .................... H01L 51/5281 445/24 |
| 2015/0287768 | A1* | 10/2015 | Sato .................... H01L 27/3232 257/40 |
| 2017/0016930 | A1* | 1/2017 | Qiu .................... G02F 1/13439 |
| 2019/0204642 | A1 | 7/2019 | Song et al. |
| 2019/0361310 | A1* | 11/2019 | Kim ........................ G02F 1/155 |
| 2020/0082144 | A1 | 3/2020 | Lin et al. |

FOREIGN PATENT DOCUMENTS

| | | |
|---|---|---|
| CN | 106328689 A | 1/2017 |
| CN | 110456547 A | 11/2019 |
| CN | 110928036 A | 3/2020 |
| CN | 111258134 A | 6/2020 |
| KR | 20190068915 A | 6/2019 |

* cited by examiner

DISPLAY PANEL AND DISPLAY DEVICE

BACKGROUND OF INVENTION

Field of Invention

The present application relates to a field of display, and in particular to a display panel and a display device.

Description of Prior Art

With development of display devices, high dynamic range imaging (HDR) technology is gradually applied to general displays to realize multi-dimensional brightness adjustment of display screens.

In existing liquid crystal display (LCD) panels, double-layered display screens are usually used for multi-dimensional brightness adjustment. However, because this solution requires four layers of polarizers for alignment adjustment, loss in alignment accuracy and brightness of the product is increased.

Therefore, there is an urgent need for a display panel to solve the above technical problems.

SUMMARY OF INVENTION

The present application provides a display panel and a display device to solve the technical problem of the complex structure of the display panel that realizes the HDR display effect.

The present application provides a display panel. The display panel includes a first sub-display panel and a second sub-display panel disposed at a side of the first sub-display panel, the first sub-display panel includes a first substrate and a driving circuit layer disposed on the first substrate, and the driving circuit layer allows the first sub-display panel or/and the second sub-display panel to transmit light.

In the display panel of the present application, the first sub-display panel further includes a first pixel electrode layer disposed on the driving circuit layer, a first liquid crystal disposed on the first pixel electrode layer, and a first common original translation electrode layer disposed on the first liquid crystal layer, and the first pixel electrode layer and the first common electrode layer form a first electric field;

wherein the second sub-display panel includes a second common electrode layer disposed on the first substrate and opposite to the first substrate, and a second liquid crystal layer disposed between the first substrate and the second common electrode layer; and wherein the driving circuit layer includes a second pixel electrode layer disposed in a same layer as at least one metal layer in the driving circuit layer, and the second pixel electrode layer and the second common electrode layer form a second electric field.

In the display panel of the present application, the driving circuit layer includes a light-shielding layer disposed on the first substrate, an active layer disposed on the light-shielding layer, a gate layer disposed on the active layer, a source/drain layer disposed on the gate layer, and the second pixel electrode layer is disposed in a same layer as at least one of the light-shielding layer, the active layer, the gate layer, and the source/drain layer.

In the display panel of the present application, the driving circuit layer further includes a third common electrode layer disposed between the source/drain layer and the first pixel electrode layer, and the third common electrode layer and the first pixel electrode layer form a third electric field.

In the display panel of the present application, the display panel further includes a first polarizer layer disposed between the first sub-display panel and the second sub-display panel, a second polarizer layer disposed on a side of the first sub-display panel away from the second sub-display panel, and a third polarizer layer disposed on a side of the second sub-display panel away from the first sub-display panel.

In the display panel of the present application, one of the first sub-display panel and the second sub-display panel is a liquid crystal display panel, and the other one of the first sub-display panel and the second sub-display panel is an OLED display panel.

In the display panel of the present application, the first sub-display panel further includes a first pixel electrode layer disposed on the driving circuit layer, and a first light-emitting layer disposed on the first pixel electrode layer, and a first cathode reflective layer disposed on the first light-emitting layer;

wherein the second sub-display panel includes a second liquid crystal layer disposed on a side of the first substrate away from the driving circuit layer, and a second common electrode layer disposed on the second liquid crystal layer; and wherein the driving circuit layer includes a second pixel electrode layer disposed in a same layer as at least one metal layer in the driving circuit layer, and the second pixel electrode layer and the second common electrode layer form a second electric field.

In the display panel of the present application, the first sub-display panel further includes a first pixel electrode layer disposed on the driving circuit layer, a first liquid crystal disposed on the first pixel electrode layer, and a first common electrode layer disposed on the first liquid crystal layer, and the first pixel electrode layer and the first common electrode layer form a first electric field;

wherein the second sub-display panel includes a second pixel electrode layer disposed on a side of the first substrate away from the driving circuit layer, a second light-emitting layer disposed on the second pixel electrode layer, and a second cathode reflective layer disposed on the second light-emitting layer; and wherein the second pixel electrode layer is electrically connected to the source/drain layer or the first pixel electrode layer in the driving circuit layer through a first via hole.

In the display panel of the present application, the display panel further includes a first polarizer layer disposed between the first sub-display panel and the second sub-display panel, and a fourth polarizer layer disposed on a side of the first sub-display panel away from the second sub-display panel or on a side of the second sub-display panel away from the first sub-display panel.

In the display panel of the present application, the display panel further includes a second substrate disposed on a side of the first sub-display panel away from the second sub-display panel and a third substrate disposed on a side of the second sub-display panel away from the first sub-display panel, and a thickness of the first substrate is smaller than a thickness of the second substrate or the third substrate.

The present application also proposes a display device. The display device includes a display panel, wherein the display panel includes a first sub-display panel and a second sub-display panel disposed at a side of the first sub-display panel, the first sub-display panel includes a first substrate and a driving circuit layer disposed on the first substrate, and the driving circuit layer allows the first sub-display panel or/and the second sub-display panel to transmit light.

In the display device of the present application, the first sub-display panel further includes a first pixel electrode layer disposed on the driving circuit layer, a first liquid crystal disposed on the first pixel electrode layer, and a first common electrode layer disposed on the first liquid crystal layer, and the first pixel electrode layer and the first common electrode layer form a first electric field;

wherein the second sub-display panel includes a second common electrode layer disposed on the first substrate and opposite to the first substrate, and a second liquid crystal layer disposed between the first substrate and the second common electrode layer; and wherein the driving circuit layer includes a second pixel electrode layer disposed in a same layer as at least one metal layer in the driving circuit layer, and the second pixel electrode layer and the second common electrode layer form a second electric field.

In the display device of the present application, the driving circuit layer includes a light-shielding layer disposed on the first substrate, an active layer disposed on the light-shielding layer, a gate layer disposed on the active layer, a source/drain layer disposed on the gate layer, and the second pixel electrode layer is disposed in a same layer as at least one of the light-shielding layer, the active layer, the gate layer, and the source/drain layer.

In the display device of the present application, the driving circuit layer further includes a third common electrode layer disposed between the source/drain layer and the first pixel electrode layer, and the third common electrode layer and the first pixel electrode layer form a third electric field.

In the display device of the present application, the display panel further includes a first polarizer layer disposed between the first sub-display panel and the second sub-display panel, a second polarizer layer disposed on a side of the first sub-display panel away from the second sub-display panel, and a third polarizer layer disposed on a side of the second sub-display panel away from the first sub-display panel.

In the display device of the present application, one of the first sub-display panel and the second sub-display panel is a liquid crystal display panel, and the other one of the first sub-display panel and the second sub-display panel is an OLED display panel.

In the display device of the present application, the first sub-display panel further includes a first pixel electrode layer disposed on the driving circuit layer, and a first light-emitting layer disposed on the first pixel electrode layer, and a first cathode reflective layer disposed on the first light-emitting layer;

wherein the second sub-display panel includes a second liquid crystal layer disposed on a side of the first substrate away from the driving circuit layer, and a second common electrode layer disposed on the second liquid crystal layer; and wherein the driving circuit layer includes a second pixel electrode layer disposed in a same layer as at least one metal layer in the driving circuit layer, and the second pixel electrode layer and the second common electrode layer form a second electric field.

In the display device of the present application, the first sub-display panel further includes a first pixel electrode layer disposed on the driving circuit layer, a first liquid crystal disposed on the first pixel electrode layer, and a first common electrode layer disposed on the first liquid crystal layer, and the first pixel electrode layer and the first common electrode layer form a first electric field;

wherein the second sub-display panel includes a second pixel electrode layer disposed on a side of the first substrate away from the driving circuit layer, a second light-emitting layer disposed on the second pixel electrode layer, and a second cathode reflective layer disposed on the second light-emitting layer; and wherein the second pixel electrode layer is electrically connected to the source/drain layer or the first pixel electrode layer in the driving circuit layer through a first via hole.

In the display device of the present application, the display panel further includes a first polarizer layer disposed between the first sub-display panel and the second sub-display panel, and a fourth polarizer layer disposed on a side of the first sub-display panel away from the second sub-display panel or on a side of the second sub-display panel away from the first sub-display panel.

In the display device of the present application, the display panel further includes a second substrate disposed on a side of the first sub-display panel away from the second sub-display panel and a third substrate disposed on a side of the second sub-display panel away from the first sub-display panel, and a thickness of the first substrate is smaller than a thickness of the second substrate or the third substrate.

In the present application, the display panel is provided with a driving circuit layer, which simultaneously drives adjacent two layers of the sub-display panel to emit light or transmit light, such that the adjustment of the light source by the double-layered sub-display panel enables a product to achieve multi-dimensional brightness adjustment, thereby improving the display effect of the product.

DETAILED DESCRIPTION OF PREFERRED EMBODIMENTS

Figure 1:
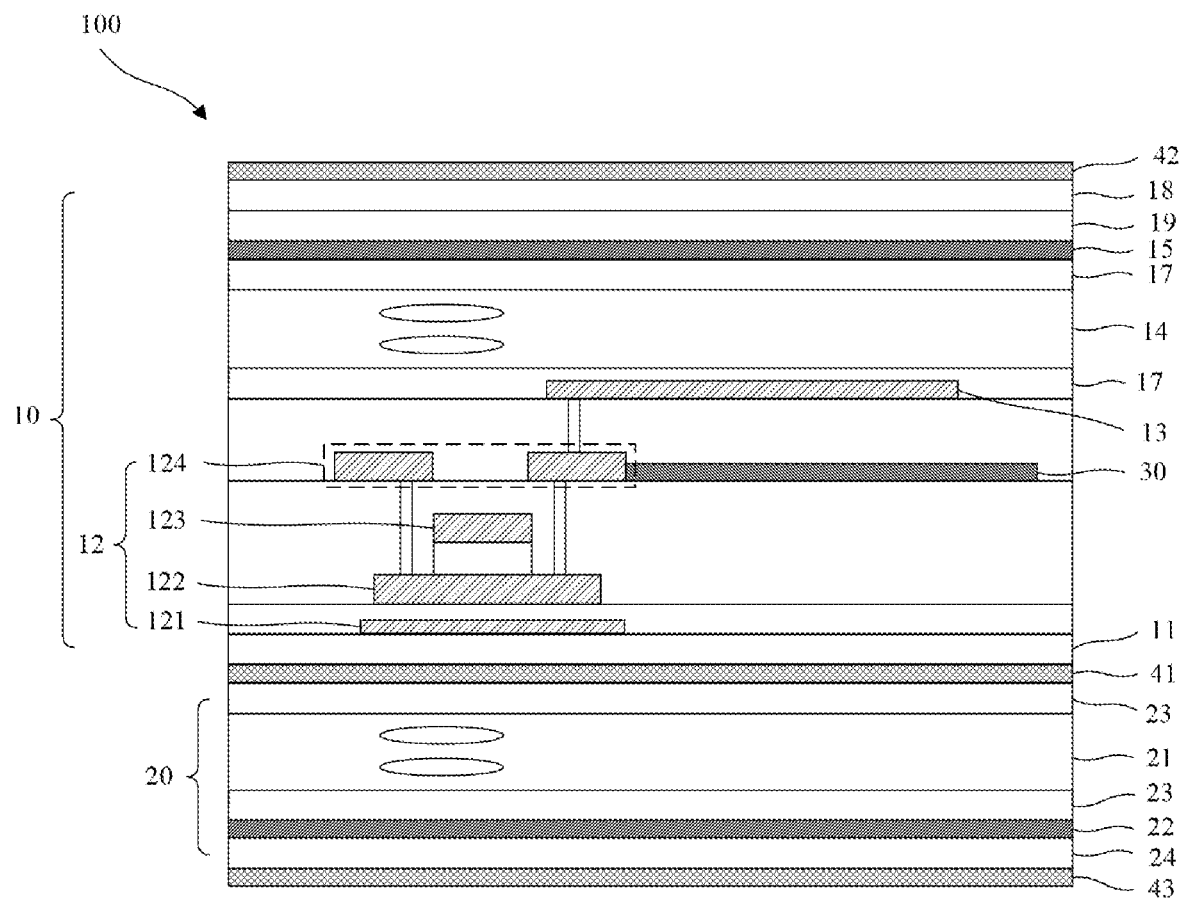
FIG. 1 is the first structure diagram of the display panel of the present application.

In order to make the purpose, technical solution, and effect of the present application clearer and more definite, the present application is further described in detail below with reference to the accompanying drawings and examples. It should be understood that the specific embodiments described herein are only used to explain the present application, and are not used to limit the present application.

In existing liquid crystal display (LCD) panels, double-layered display screens are usually used for multi-dimensional brightness adjustment. However, because this solution requires four layers of polarizers for alignment adjustment, loss in alignment accuracy and brightness of the product is increased. In order to solve the above technical problems, the present application proposes the technical solutions as follows:

Referring to FIGS. 1 to 6, the present application provides a display panel 100. The display panel 100 includes a first sub-display panel 10 and a second sub-display panel 20 disposed at a side of the first sub-display panel 10. The first sub-display panel 10 includes a first substrate 11 and a driving circuit layer 12 disposed on the first substrate 11, and the driving circuit layer 12 allows the first sub-display panel 10 or/and the second sub-display panel 20 to transmit light.

In the present application, the display panel is provided with a driving circuit layer 12, which simultaneously drives adjacent two layers of the sub-display panel 100 to emit light or transmit light, such that the adjustment of the light source by the double-layered sub-display panel 100 enables a product to achieve multi-dimensional brightness adjustment, thereby improving the display effect of the product.

The technical solution of the present application will now be described in conjunction with specific embodiments.

Embodiment 1

In the display panel 100 of the present application, the first sub-display panel 10 or the second sub-display panel 20 may be one of a liquid crystal display panel, an OLED display panel, a Micro-LED display panel, etc., which is not particularly limited herein. Referring to FIGS. 1 to 4, the first sub-display panel 10 and the second sub-display panel 20 are both liquid crystal display panels.

In the display panel 100 of the present application, the first sub-display panel 10 may further include a first pixel electrode layer 13 disposed on the driving circuit layer, a first liquid crystal 14 disposed on the first pixel electrode layer 13, and a first common electrode layer 15 disposed on the first liquid crystal layer 14, and the first pixel electrode layer 13 and the first common electrode layer 15 form a first electric field to drive the first liquid crystal layer 14 to deflect. The first common electrode layer 15 is disposed on a side of the first liquid crystal layer 14 away from the driving circuit layer 12.

In this embodiment, the second sub-display panel 20 may include a second liquid crystal layer 21 disposed on the first substrate 11 and a second common electrode layer 22 disposed on second liquid crystal layer 21, and the first common electrode layer 15 is disposed on a side of the second liquid crystal layer 21 away from the driving circuit layer 12.

In this embodiment, the driving circuit layer further includes a second pixel electrode layer 30 disposed in a same layer as at least one metal layer in the driving circuit layer, and the second pixel electrode layer 30 and the second common electrode layer 22 form a second electric field to drive the second liquid crystal layer 21 to deflect.

Referring to FIG. 1, a material of the first substrate 11 can be determined according to rigidity and flexibility of the product, such as a rigid material of glass, quartz, or a flexible material of polyimide. The specific material of the first substrate 11 is not particularly limited in detail herein.

In this embodiment, the driving circuit layer 12 may include a plurality of thin-film transistors. The thin-film transistor may be a thin-film transistor an of a etch barrier type, a back channel etch type, or a top gate type, etc., which is not particularly imitated. For example, a top-gate thin-film transistor may include a light-shielding layer 121 disposed on the first substrate 11, an active layer 122 disposed on the light-shielding layer 121, a gate layer 123 disposed on the active layer 122, and a source/drain layer 124 disposed on the gate layer 123. The above-mentioned thin-film transistor also includes an insulating layer between the light-shielding layer 121, the active layer 122, the gate layer 123, and the source/drain layer 124, which will not be described in detail herein for brevity.

Referring to FIGS. 1 to 4, the driving circuit layer 12 may further include a second pixel electrode layer 30 disposed in a same layer as at least one of the light-shielding layer 121, the active layer 122, the gate layer 123, and the source/drain layer 124

In this embodiment, the first pixel electrode layer 13, the second pixel electrode layer 30, the first common electrode layer 15, and the second common electrode layer 22 may be made of indium tin oxide (ITO).

Referring to FIG. 1, the second pixel electrode layer 30 and the source/drain layers 124 may be provided in the same layer.

In this embodiment, after the process of forming the source/drain layers 124, the process of forming the second pixel electrode layer 30 may be performed, so that the second pixel electrode layer 30 is electrically connected to the source/drain. When the display panel 100 is working, the first common electrode layer 15 inputs a constant first voltage, the second common electrode layer 22 inputs a constant second voltage, and the first pixel electrode layer 13 and the second pixel electrode receives the same pixel voltage from the source/drain. The first voltage and the pixel voltage form a first electric field to drive the first liquid crystal layer 14 to deflect, and the second voltage and the pixel voltage form a second electric field to drive the second liquid crystal layer 21 to deflect.

In this embodiment, the source/drain layer 124 can be made of the same material as the second pixel electrode layer 30, that is, the second pixel electrode layer 30 can be formed simultaneously in the process of forming the source/drain layer 124, to omit the process of forming the second pixel electrode layer 30 and simplify the manufacturing process.

The present application drives the deflection of the two liquid crystal layers through one driving circuit layer 12. When the backlight source enters the display panel 100, the deflection of the first liquid crystal layer 14 adjusts the brightness of the backlight source in a first dimension, and the deflection of the second liquid crystal layer 21 can adjust the brightness of the backlight in a second dimension. The superposition of the first dimension and the second dimension enables the display panel 100 to achieve higher-dimensional brightness adjustment, which improves the display effect of the display panel 100.

Figure 2:
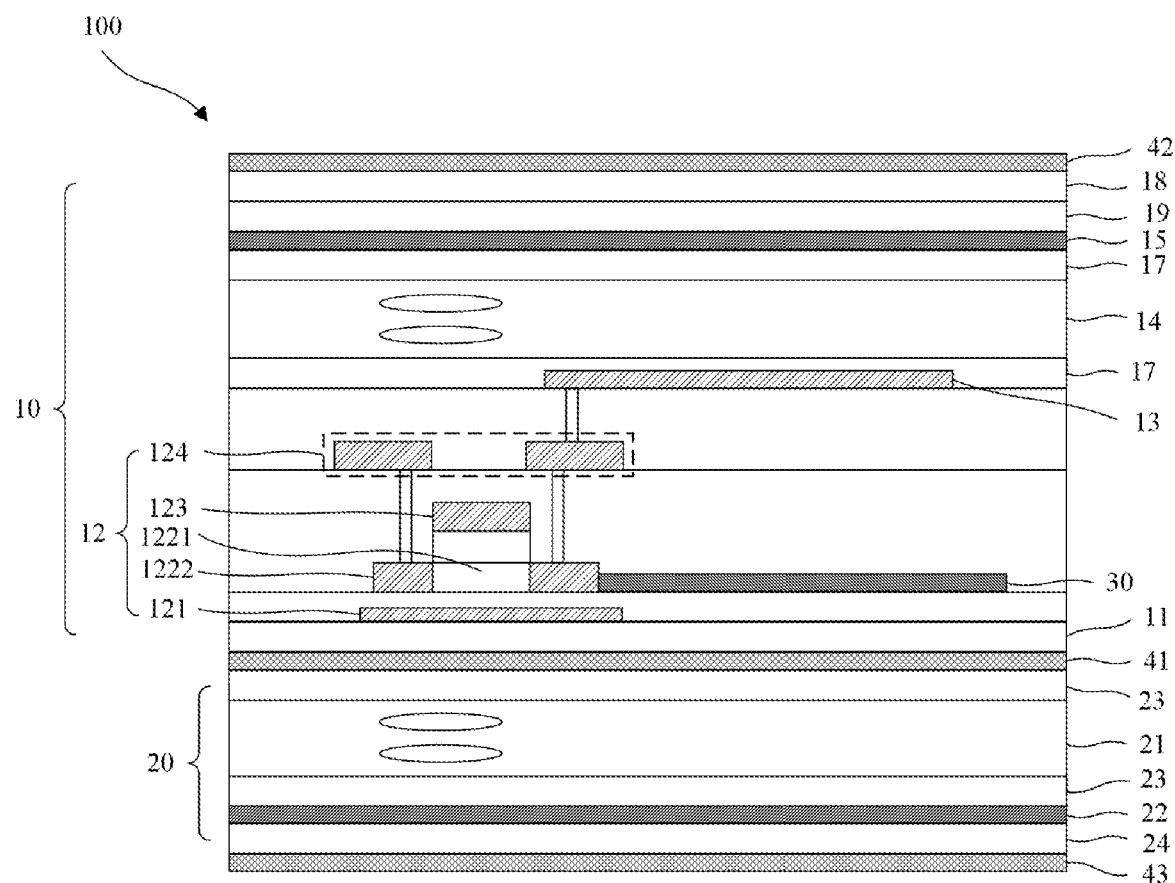
FIG. 2 is a second structure diagram of the display panel of the present application.

Referring to FIG. 2, the second pixel electrode layer 30 and the active layer 122 may be provided in the same layer.

In this embodiment, the active layer 122 may include a channel region 1221 and a doped region 1222 disposed at opposite sides of the channel region 1221, and the doped region 1221 disposed at one side of the active layer 122 is electrically connected to the second pixel electrode layer 30 to transmit the pixel voltage transmitted to the source/drain to the second pixel electrode layer 30 and the first pixel electrode layer 13, and the pixel voltage and the first voltage or the second voltage form a corresponding electric field to drive the deflection of the liquid crystal molecules, thereby realizing multi-dimensional brightness adjustment of the display panel 100.

In this embodiment, the structure of the second pixel electrode layer 30 in FIG. 2 is smaller than the structure of the second pixel electrode layer 30 in FIG. 1 and the second common electrode. The second pixel electrode layer 30 is the second voltage between the second common electrode layer 22 has a greater intensity, which is more conducive to driving the second liquid crystal layer 21 to deflect through the driving circuit layer 12.

Figure 3:
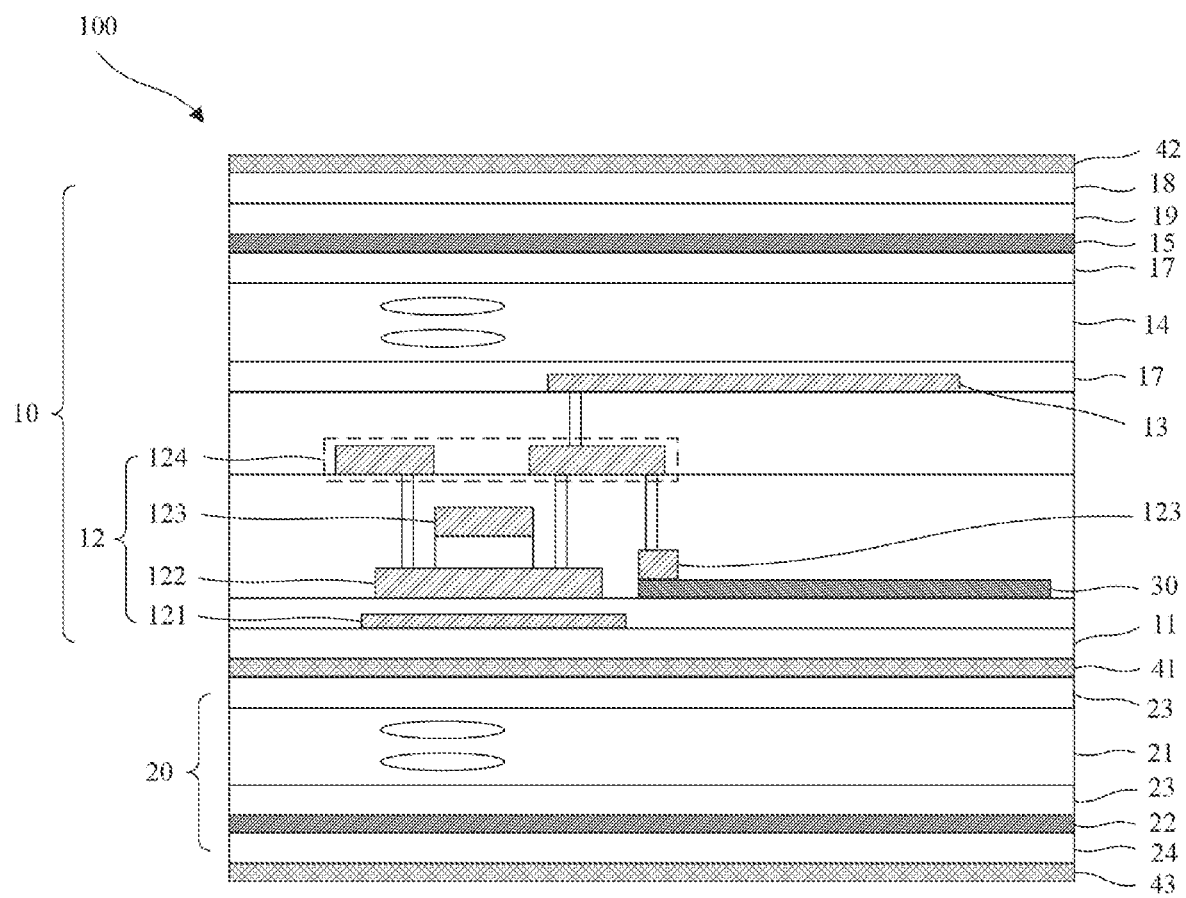
FIG. 3 is a third structural diagram of the display panel of the present application.

Referring to FIG. 3, the active layer 122 is indirectly electrically connected to the second pixel electrode layer 30, and the source/drain layer 124 is electrically connected to the second pixel electrode layer 30 through via holes. Since a distance between the active layer 122 and the source/drain layer 124 is relatively large, if the source/drain layer 124 is electrically connected to the second pixel electrode layer 30 directly through the via holes, an opening of the via hole is larger, which increases etching difficulty. In the structure of FIG. 3, a conductive block 1231 is provided as a step at the edge of the second pixel electrode layer 30 to reduce the distance between the second pixel electrode layer 30 and the source/drain layer 124 and reduce the opening size of a corresponding contact via. In this embodiment, the conductive block 1231 disposed on the second pixel electrode layer 30 can be formed by a separate process, or a conductive block 1231 is directly formed in the region during the process of forming the gate layer 123, that is, the conductive block 1231 and the gate layer 123 is formed in the same mask process.

In this embodiment, the second pixel electrode layer 30 can also be provided in the same layer as the light-shielding layer 121 closer to the second common electrode layer 22; or, a superimposed electrode formed by any two or three of the above embodiments, which is not particularly limited herein.

In the display panel 100 of the present application, the driving circuit layer 12 further includes a third common electrode layer 16 between the source/drain layer 124 and the first pixel electrode layer 13. The third common electrode layer 16 A third electric field is formed with the first pixel electrode layer 13, and the first electric field and the third electric field drive the first liquid crystal layer 14 to deflect.

Figure 4:
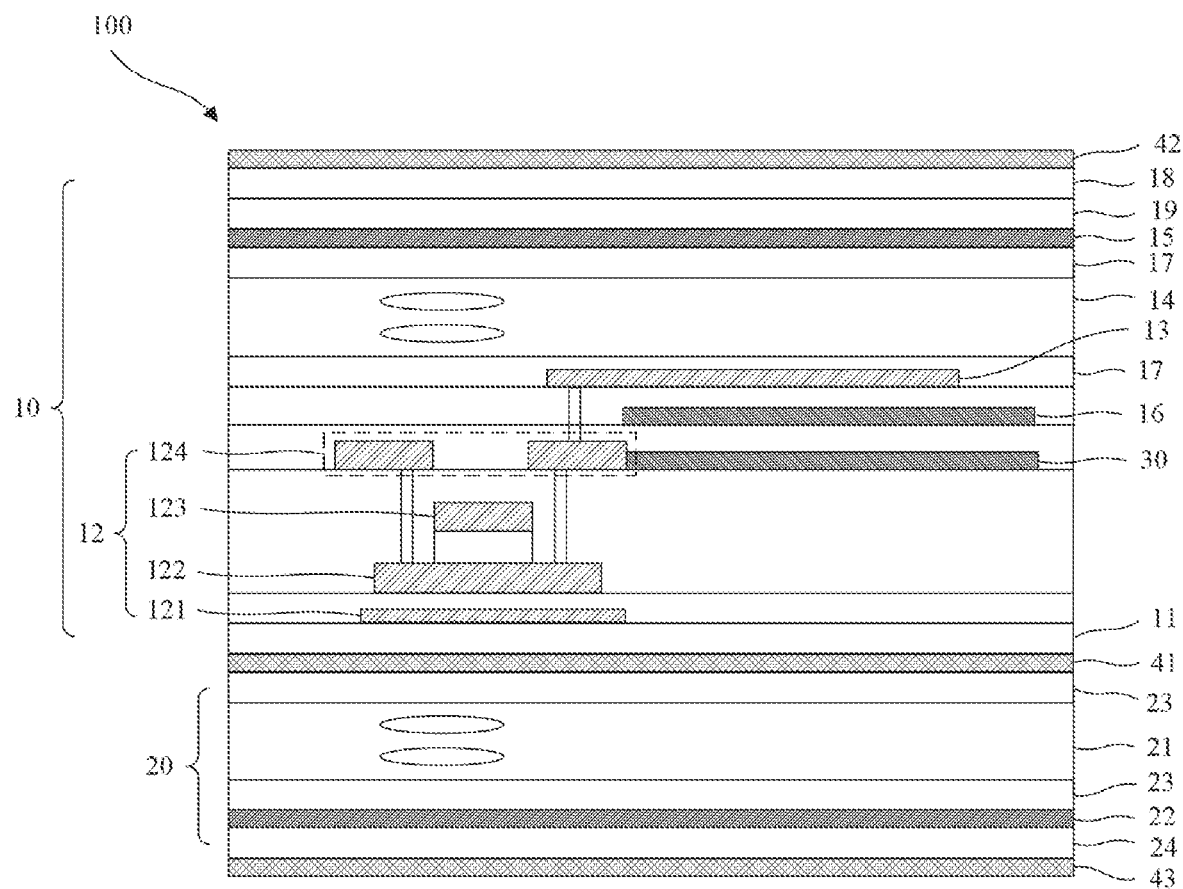
FIG. 4 is a fourth structural diagram of the display panel of the present application.

Taking the structure of FIG. 1 as an example, referring to FIG. 4, the third common electrode layer 16 may be located in an insulating layer between the source/drain layer 124 and the first pixel electrode layer 13, such as a passivation layer. Alternatively, two insulating layers are provided, and the third common electrode layer 16 is disposed between two different insulating layers.

In this embodiment, the third common electrode layer 16 and the first pixel electrode layer 13 form a third electric field. The third electric field is a transverse electric field. The first common electrode layer 15 and the first pixel electrode layer 13 form a first electric field. The first electric field is a vertical electric field, and the superposition of the vertical electric field and the transverse electric field forms a new driving electric field to drive the liquid crystal molecules in the first liquid crystal layer 14 to deflect.

In the embodiments of the present application, a voltage level in the first common electrode layer 15, the second common electrode layer 22, or the third common electrode layer 16 is not particularly limited, and the three may be equal or different.

In the above-mentioned structures of FIG. 1 to FIG. 4, the present application can also provide two thin-film transistors in any one of sub-pixel areas. The source/drain of one of the thin-film transistors is electrically connected to the first pixel electrode layer 13, and another one of the thin-film transistors is electrically connected to the second pixel electrode layer 30, such that two different thin-film transistors are used to input different pixel voltage to different pixel electrode layers, thereby controlling the liquid crystal molecules in the two liquid crystal layers in the same sub-pixel to deflect at different angles. For example, a gray scale of brightness display of the driven backlight source corresponding to the first liquid crystal layer 14 is 0 to 255, a gray scale of brightness display of the driven backlight source corresponding to the second liquid crystal layer is 0 to 255, the superposition of the first liquid crystal layer 14 and the second liquid crystal layers 21 makes the gray scale of brightness display of the backlight source ranging from 0 to 65535, which is changed from the original 8-bit image data to 16-bit image data, and the display panel 100 has more delicate and accurate display. Compared with the structures of FIGS. 1 to 4, the structure of this embodiment is equivalent to a structure sacrificing part of the aperture ratio in exchange for high-dimensional brightness adjustment.

In the above-mentioned structures of FIGS. 1 to 4, for example, the source is a pixel voltage input terminal, and the drain is a pixel voltage output terminal, such that the second pixel electrode layer 30 is electrically connected to the source, and the first pixel electrode layer 13 is electrically connected to the drain, and a voltage divider module is connected in series at a port of the drain to adjust the voltage input to the first pixel electrode layer 13. In this embodiment, one thin-film transistor can be used to input different pixel voltages, and compared with the foregoing embodiments, under the premise of realizing multi-dimensional brightness adjustment, the aperture ratio of the display panel 100 is guaranteed.

In the display panel 100 of the present application, the display panel 100 further includes a first polarizer layer 41 disposed between the first sub-display panel 10 and the second sub-display panel 20, a second polarizer layer 42 disposed on a side of the first sub-display panel 10 away from the second sub-display panel 20, and a third polarizer layer 43 disposed on a side of the second sub-display panel 20 away from the first sub-display panel 10.

Referring to FIGS. 1 to 4, since the structure of the present application is a liquid crystal display panel, and light entering the liquid crystal layer needs to be polarized light, a polarizer needs to be provided on a side of the second sub-display panel 20 close to the backlight source. The second sub-display panel 20 may include a third polarizer layer 43, a third substrate 24 disposed on the third polarizer layer 43, a second common electrode layer 22 disposed on the third substrate 24, a second common electrode layer 22 disposed on the third substrate 24, a second liquid crystal layer 21 disposed on the second common electrode layer 22, a first polarizer layer 41 disposed on the second liquid crystal layer 21, and a third polarizer layer 43 disposed on a side of the first sub-display panel 10 away from the first polarizer layer 41.

In the above embodiment, a second substrate 18 is further provided between the second polarizer layer 42 and the first common electrode layer 15. Since the third substrate 24 and the second substrate 18 are disposed on opposite sides of the display panel 100, the first substrate 11 is located between the first sub-display panel 10 and the second sub-display panel 20, in order to further reduce the size of the display panel 100 and increase the effect of the second pixel electrode layer 30 on the second liquid crystal layer 21. In the present application, a thickness of the first substrate 11 is smaller than a thickness of the second substrate 18 or the third substrate 24. Alternatively, the first substrate 11 is set as a flexible substrate, and the second substrate 18 and the third substrate 24 are set as a rigid substrate.

In the above embodiment, the display panel further includes a first alignment layer 17 disposed on opposite sides of the first liquid crystal layer 14 and a second alignment layer 23 disposed on opposite sides of the second liquid crystal layer 21, which will not be described in detail herein.

Referring to FIGS. 1 to 4, the display panel 100 further includes a color filter layer 19 located in the first sub-display panel 10. When the first sub-display panel 10 has a conventional structure, the color filter layer 19 may be disposed on the side of the first sub-display panel 10 close to the first common electrode layer 15; when the first sub-display panel When 10 is a COA (CF on Array, color filter layer 19 is disposed on the array layer) substrate, the color filter layer 19 may be disposed on the side of the first sub-display panel 10 close to the first pixel electrode layer 13. For example, the structure of the present application is a conventional display panel 100, and the color filter layer 19 may include at least three color resist units and a light-shielding layer 121 located between two adjacent color resist units. One said color resistance unit corresponds to one said pixel unit. The color resistance unit may be one of red color resistance, green color resistance or blue color resistance. A black light-shielding unit is arranged between two adjacent color resistance units.

In the present application, a driving circuit layer 12 is provided in the display panel 100, and the driving circuit layer 12 drives the liquid crystal molecules of two adjacent liquid crystal layers to deflect at the same time, so that the two liquid crystal layers can adjust the brightness of the backlight source to realize the multi-dimensional brightness adjustment of the display panel 100, thus improving the effect of the display panel 100.

Embodiment 2

This embodiment is the same as or similar to the first embodiment, except that as follows.

In the display panel 100 of the present application, one of the first sub display panel 10 and the second sub display panel 20 is a liquid crystal display panel, and the other one of the first sub display panel 10 and the second sub display panel 20 is an OLED display panel.

Figure 5:
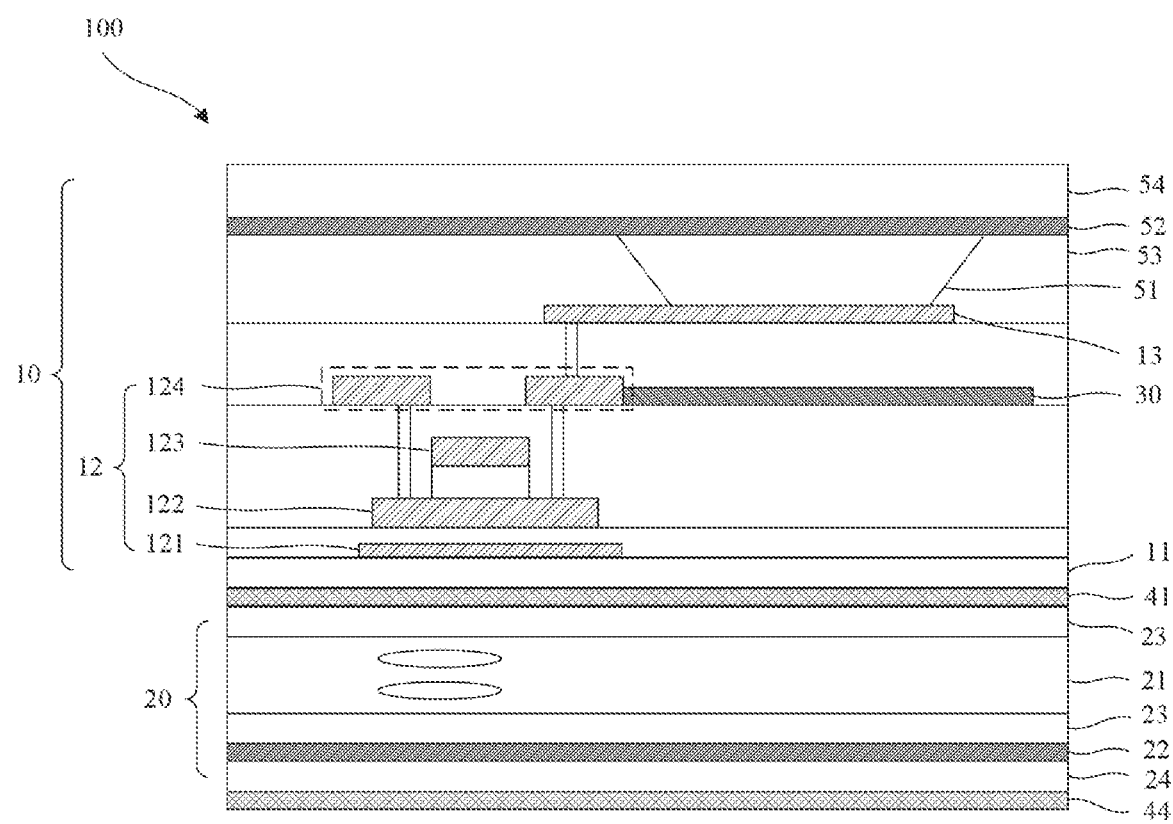
FIG. 5 is a fifth structure diagram of the display panel of the present application.

For example, in the structure shown in FIG. 5, the second sub-display panel 20 is a liquid crystal display panel, and the first sub-display panel 10 is an OLED display panel. Since the lower liquid crystal display panel is required to serve as a dimming component, the first sub-display panel 10 is a bottom-emitting OLED display panel. In the structure shown in FIG. 6, the first sub-display panel 10 is a liquid crystal display panel, and the second sub-display panel 20 is an OLED display panel, which is equivalent to a structure in which the lower sub-display panel 100 emits light, and the upper sub-display panel 100 is a dimming member, while the second sub-display panel 20 is an inverted bottom-emitting OLED display panel, that is, the light of the top-emitting OLED display panel is still emitted in a direction from the anode layer side, and the bottom-emitting OLED display panel is merely inverted to form a top-emitting one.

Referring to FIG. 5, in the display panel 100 of the present application, the first sub-display panel 10 further includes a first pixel electrode layer 13 disposed on the driving circuit layer 12, a first light-emitting layer 51 disposed on the first pixel electrode layer 13, a first cathode reflective layer 52 disposed on the first light-emitting layer 51, and a pixel definition layer 53 disposed in the same layer as the first light-emitting layer 51. The second sub-display panel 20 includes a second liquid crystal layer 21 disposed on the first substrate 11 and on a side away from the driving circuit layer 12, and a second common electrode layer 22 disposed on the second liquid crystal layer 21.

In this embodiment, the driving circuit layer further includes a second pixel electrode layer 30 provided in the same layer as at least one metal layer in the driving circuit layer, and the second pixel electrode layer 30 and the second common electrode layer 22 form a second electric field to drive the second liquid crystal layer 21 to deflect.

The structures of the driving circuit layer 12 and the second pixel electrode layer 30 in this embodiment can be referred to the structure of the first embodiment, which will not be repeated herein for brevity.

In this embodiment, the first pixel electrode layer 13 is equivalent to the anode layer in the OLED display panel. Part of the light emitted by the light-emitting layer is led out from a light-exiting side through the anode layer, and part of the light is led out from the light-exiting side of the product through the first cathode reflective layer 52.

In this embodiment, since the light entering the liquid crystal layer is polarized light, a first polarizer layer 41 is necessary to be provided between the first sub-display panel 10 and the second sub-display panel 20, and on the light-exiting side of the display panel 100, that is, a fourth polarizer layer 44 is provided on a side of the second sub-display panel 20 away from the first sub-display panel 10, and the fourth polarizer layer 44 is equivalent to the third polarizer layer 43 in the first embodiment.

In this embodiment, the structure disposed on the first cathode reflective layer 52 can encapsulate the cover layer 54, and the structure is not described in detail in the present application.

Figure 6:
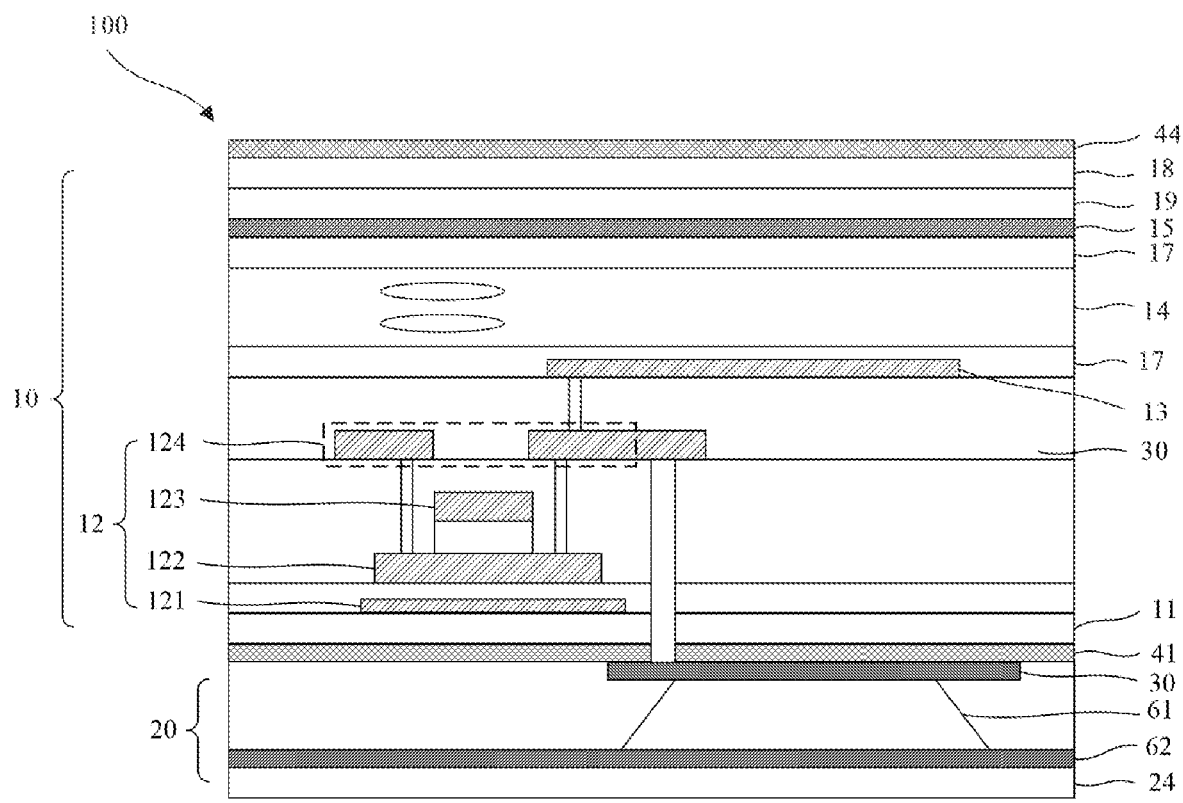
FIG. 6 is a sixth structural diagram of the display panel of the present application.

Referring to FIG. 6, in the display panel 100 of the present application, the first sub-display panel 10 further includes a first pixel electrode layer 13 disposed on the substrate and on a side of the driving circuit layer 12 away from the driving circuit layer 12, a second light emitting layer 30 disposed on the second pixel electrode layer 61, and a second cathode reflective layer 62 disposed on the second light-emitting layer 61. The second pixel electrode layer 30 is electrically connected to the source/drain layer 124 or the first pixel electrode layer 13 in the driving circuit layer 12 through a first via hole.

In this embodiment, since the OLED display panel is located in the lower structure of the display panel 100, the second cathode reflective layer 62 is close to the third substrate 24, and the second pixel electrode layer 30 is disposed close to the first substrate 11. Since the second pixel electrode layer 30 and the driving circuit layer 12 are spaced apart by the first substrate 11 and the first polarizer layer 41, in the structure of this embodiment, the via hole structure needs to be formed corresponding to the first substrate 11 and the first polarizer layer 41, so that the pixel voltage output from the source/drain of the driving circuit layer 12 can be input to the second pixel electrode layer 30, and the pixel voltage of the second pixel electrode layer 30 and the second cathode reflective layer 62 form a structure for driving the second light-emitting layer 61 to emit light.

In this embodiment, since the light entering the liquid crystal layer is polarized light, a first polarizer layer 41 is necessary to be provided between the first sub-display panel 10 and the second sub-display panel 20, and on the light-exiting side of the display panel 100, that is, a fourth polarizer layer 44 is provided on a side of the first sub-display panel 10 away from the second sub-display panel 20, and the fourth polarizer layer 44 is equivalent to the second polarizer layer 43 in the first embodiment.

The present application also proposes a display device, wherein the display device includes the above-mentioned display panel. When the display panels are all liquid crystal display panels, the display device may include a polarizer disposed on one side of the display panel. The working principle of the display device in this embodiment is the same as or similar to the working principle of the above-mentioned display panel, and will not be repeated herein for brevity.

The present application provides a display panel and a display device. The display panel includes a first sub-display panel and a second sub-display panel disposed on one side of the first sub-display panel. The first sub-display panel includes a first substrate and a driving circuit layer disposed on the first substrate, wherein the driving circuit layer drives the first sub-display panel or/and the second sub-display panel to transmit light. In the present application, a driving circuit layer is provided in the display panel, and the driving circuit layer simultaneously drives adjacent two layers of the sub-display panel to emit light or transmit light, such that the adjustment of the light source by the double-layered sub-display panel enables a product to achieve multi-dimensional brightness adjustment, thereby improving the display effect of the product.

It can be understood that for those of ordinary skill in the art, equivalent substitutions or changes can be made according to the technical solutions and inventive concepts of the present application, and all these changes or substitutions shall fall within the protection scope of the appended claims of the present application.

What is claimed is:

1. A display panel, wherein the display panel comprises a first sub-display panel and a second sub-display panel disposed at a side of the first sub-display panel, the first sub-display panel comprises a first substrate and a driving circuit layer disposed on the first substrate, and the driving circuit layer allows the first sub-display panel or/and the second sub-display panel to transmit light;
    wherein the driving circuit layer comprises a source/drain layer and a second pixel electrode layer disposed in a same layer as the source/drain layer;
    wherein one of the first sub-display panel and the second sub-display panel is a liquid crystal display panel, and the other one of the first sub-display panel and the second sub-display panel is an OLED display panel;
    wherein the first sub-display panel further comprises a first pixel electrode layer disposed on the driving circuit layer, and a first light-emitting layer disposed on the first pixel electrode layer, and a first cathode reflective layer disposed on the first light-emitting layer;
    wherein the second sub-display panel comprises a second liquid crystal layer disposed on a side of the first substrate away from the driving circuit layer, and a second common electrode layer disposed on the second liquid crystal layer; and
    wherein the second pixel electrode layer and the second common electrode layer form a second electric field.

2. The display panel according to claim 1, wherein the display panel further comprises a first polarizer layer disposed between the first sub-display panel and the second sub-display panel, and a fourth polarizer layer disposed on a side of the first sub-display panel away from the second sub-display panel or on a side of the second sub-display panel away from the first sub-display panel.

3. The display panel according to claim 1, wherein the display panel further comprises a second substrate disposed on a side of the first sub-display panel away from the second sub-display panel and a third substrate disposed on a side of the second sub-display panel away from the first sub-display panel, and a thickness of the first substrate is smaller than a thickness of the second substrate or the third substrate.

4. A display device, comprising a display panel, wherein the display panel comprises a first sub-display panel and a second sub-display panel disposed at a side of the first sub-display panel, the first sub-display panel comprises a first substrate and a driving circuit layer disposed on the first substrate, and the driving circuit layer allows the first sub-display panel or/and the second sub-display panel to transmit light;
    wherein the driving circuit layer comprises a source/drain layer and a second pixel electrode layer disposed in a same layer as the source/drain layer;
    wherein one of the first sub-display panel and the second sub-display panel is a liquid crystal display panel, and the other one of the first sub-display panel and the second sub-display panel is an OLED display panel;
    wherein the display panel further comprises a second substrate disposed on a side of the first sub-display panel away from the second sub-display panel;
    wherein the first sub-display panel further comprises a first pixel electrode layer disposed on the driving circuit layer, and a first light-emitting layer disposed on the first pixel electrode layer, and a first cathode reflective layer disposed on the first light-emitting layer;
    wherein the second sub-display panel comprises a second liquid crystal layer disposed on a side of the first substrate away from the driving circuit layer, and a second common electrode layer disposed on the second liquid crystal layer; and
    wherein the driving circuit layer comprises a second pixel electrode layer disposed in a same layer as at least one metal layer in the driving circuit layer, and the second pixel electrode layer and the second common electrode layer form a second electric field.

5. The display device according to claim 4, wherein the display panel further comprises a first polarizer layer disposed between the first sub-display panel and the second sub-display panel, and a fourth polarizer layer disposed on a side of the first sub-display panel away from the second sub-display panel or on a side of the second sub-display panel away from the first sub-display panel.

6. The display device according to claim 4, wherein the display panel further comprises a third substrate disposed on a side of the second sub-display panel away from the first sub-display panel, and a thickness of the first substrate is smaller than a thickness of the second substrate or the third substrate.

* * * * *